(12) United States Patent
Suzuki

(10) Patent No.: US 11,205,580 B2
(45) Date of Patent: Dec. 21, 2021

(54) METHOD OF MANUFACTURING MOLDED CHIP

(71) Applicant: DISCO CORPORATION, Tokyo (JP)

(72) Inventor: Katsuhiko Suzuki, Tokyo (JP)

(73) Assignee: DISCO CORPORATION, Tokyo (JP)

(*) Notice: Subject to any disclaimer, the term of this patent is extended or adjusted under 35 U.S.C. 154(b) by 28 days.

(21) Appl. No.: 16/878,734

(22) Filed: May 20, 2020

(65) Prior Publication Data
US 2020/0373172 A1 Nov. 26, 2020

(30) Foreign Application Priority Data

May 24, 2019 (JP) .............................. JP2019-098076

(51) Int. Cl.
*H01L 21/56* (2006.01)
*H01L 21/78* (2006.01)

(52) U.S. Cl.
CPC ............ *H01L 21/565* (2013.01); *H01L 21/78* (2013.01)

(58) Field of Classification Search
None
See application file for complete search history.

(56) References Cited

U.S. PATENT DOCUMENTS

| 2010/0311223 A1* | 12/2010 | Chun ...................... H01L 21/78 438/462 |
| 2017/0032981 A1* | 2/2017 | Chinnusamy ....... H01L 21/6835 |
| 2018/0061711 A1* | 3/2018 | Yoshida .................. H01L 23/12 |

FOREIGN PATENT DOCUMENTS

| JP | 2012062372 A | 3/2012 |
| JP | 2017022280 A | 1/2017 |

OTHER PUBLICATIONS

Search report issued in counterpart Singapore patent application No. 10202004669X, dated Mar. 29, 2021.

* cited by examiner

*Primary Examiner* — Jay C Chang
(74) *Attorney, Agent, or Firm* — Greer Burns & Crain Ltd.

(57) ABSTRACT

A method of manufacturing a molded chip includes a preparing step of sticking device faces of a plurality of device chips arrayed to a protective member that is thermally insulative, thereby forming a chip group; a molding step of, after the preparing step, supplying a molding resin to reverse sides of the device chips and gaps between the device chips, thereby forming a molded wafer in which the reverse sides and side faces of the device chips are covered with a resin molding; and a molded wafer dividing step of, after the molding step, dividing the molded wafer along centers of the gaps filled with the resin molding into molded chips on the basis of an image in which a face side of the molded wafer has been captured.

8 Claims, 16 Drawing Sheets

METHOD OF MANUFACTURING MOLDED CHIP

BACKGROUND OF THE INVENTION

Field of the Invention

The present invention relates to a method of manufacturing a molded chip.

Description of the Related Art

There have been known technologies for covering semiconductor device chips with resin moldings to protect the semiconductor device chips from changes in the external environment. For example, the technologies include ball grid arrays (BGA), chip size packages (CSP), etc. According to the technologies, since a chip and a substrate on which the chip is mounted are connected to each other by wires, the completed package is much larger than the chip. There has been devised a package called a wafer level chip size package (WL-CSP) as a solution to the problem. However, the package is not sufficiently covered because only one of the six surfaces of the chip is covered with a resin molding.

Furthermore, a process has been devised to cover more chip surfaces. According to the process, grooves are formed in the face side of a wafer along streets or projected dicing lines thereon, and the face side of the wafer and the grooves are covered and filled with a molding resin. Thereafter, the reverse side of the wafer is ground, and the resin moldings in the grooves are cut along their centers, thereby producing device chips each having molded five surfaces (see, for example, JP2017-022280A).

SUMMARY OF THE INVENTION

However, the technology disclosed in JP2017-022280A is disadvantageous in that after the device-side surfaces of the device chips have been molded, the bumps connected to the electrodes on the devices are covered with resin moldings, resulting in restraints on electric connections.

It is therefore an object of the present invention to provide a method of manufacturing a molded chip which is able to secure electric connections of a device thereof.

In accordance with as aspect of the present invention, there is provided a method of manufacturing a molded chip, including a preparing step of sticking device faces of a plurality of device chips arrayed to a protective member that is thermally insulative, thereby forming a chip group of the device chips, a molding step of, after the preparing step, supplying a molding resin to reverse sides of the device chips and gaps between the device chips, thereby forming a molded wafer in which the reverse sides and side faces of the device chips are covered with a resin molding, and a molded wafer dividing step of, after the molding step, dividing the molded wafer along centers of the gaps filled with the resin molding into molded chips on the basis of an image in which a face side of the molded wafer has been imaged.

Preferably, the preparing step includes a groove forming step of forming grooves in a wafer having a plurality of areas demarcated by a grid of projected dicing lines on a face side of the wafer and a plurality of devices formed respectively in the areas, to a depth larger than a finished thickness, a protective member sticking step of sticking the protective member to the face side of the wafer in which the grooves have been formed, and a grinding step of grinding a reverse side of the wafer, thereby exposing the grooves on the wafer and dividing the wafer into the device chips.

Preferably, the preparing step includes a thinning step of grinding a reverse side of a wafer having a plurality of areas demarcated by a grid of projected dicing lines on a face side of the wafer and a plurality of devices formed respectively in the areas, thereby thinning the wafer to a finished thickness, and a dividing step of dividing the thinned wafer along the projected dicing lines.

Preferably, the method further includes, an expanding step of, after the preparing step and before the molding step, expanding the protective member in planar directions, thereby widening distances between the device chips.

Preferably, the wafer has an arcuate outer circumferential side face, the preparing step includes an edge trimming step of trimming the arcuate portion on the face side of the wafer off along the outer circumferential edge, and a molding resin supplied to the reverse side of the wafer is pressed against the reverse side of the wafer in a mold in the molding step.

Preferably, the method further includes, a protective member peeling step of, after the molding step, sticking an adhesive tape to the reverse side of the molded wafer and peeling off the protective member from the face side of the molded wafer, in which the molded wafer is divided from the face side of the molded wafer in the molded wafer dividing step.

The method of manufacturing a molded chip according to the present invention is advantageous in that it secures electric connections of the devices of the device chips.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Preferred embodiments of the present invention will hereinafter be described in detail below with reference to the drawings. The present invention is not limited to the details of the embodiments described below. The components described below cover those which could easily be anticipated by those skilled in the art and those which are essentially identical thereto. Furthermore, the arrangements described below can be used in appropriate combinations. Various omissions, replacements, or changes of the arrangements may be made without departing from the scope of the present invention.

First Embodiment

Figure 1:
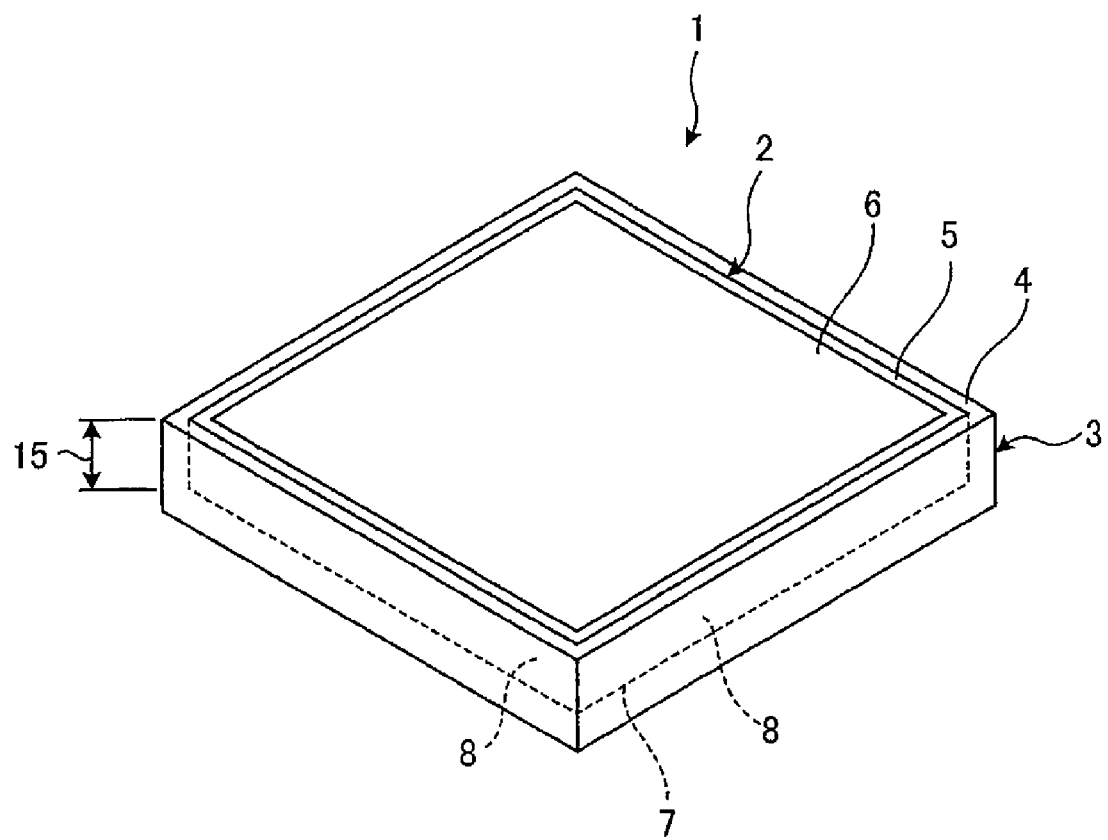
FIG. 1 is a perspective view illustrating by way of example a molded chip manufactured by a method of manufacturing a molded chip according to a first embodiment of the present invention.
Figure 2:
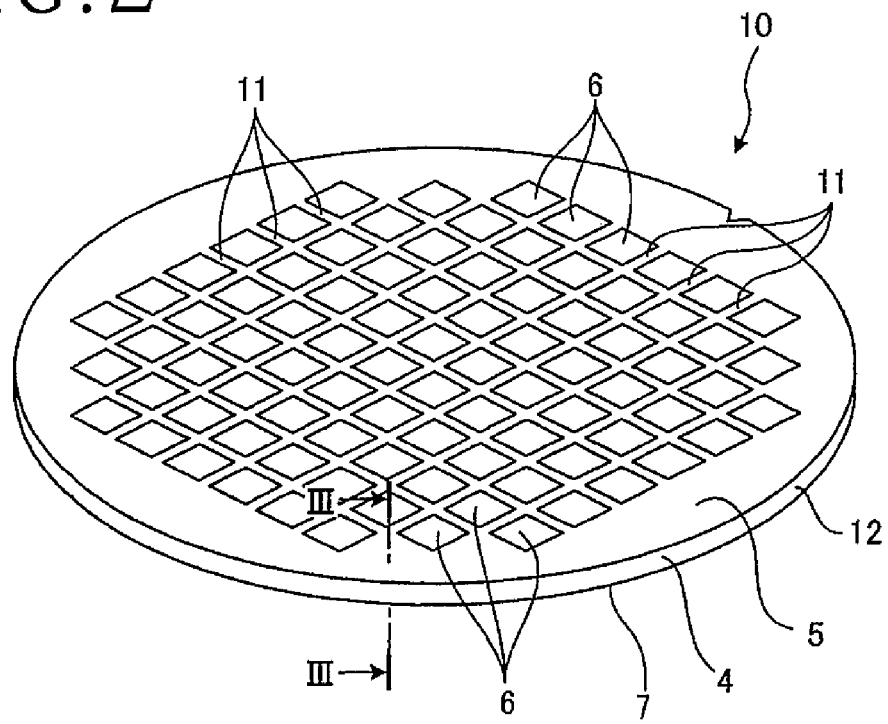
FIG. 2 is a perspective view illustrating by way of example a wafer from which the molded chip illustrated in FIG. 1 is manufactured.
Figure 3:
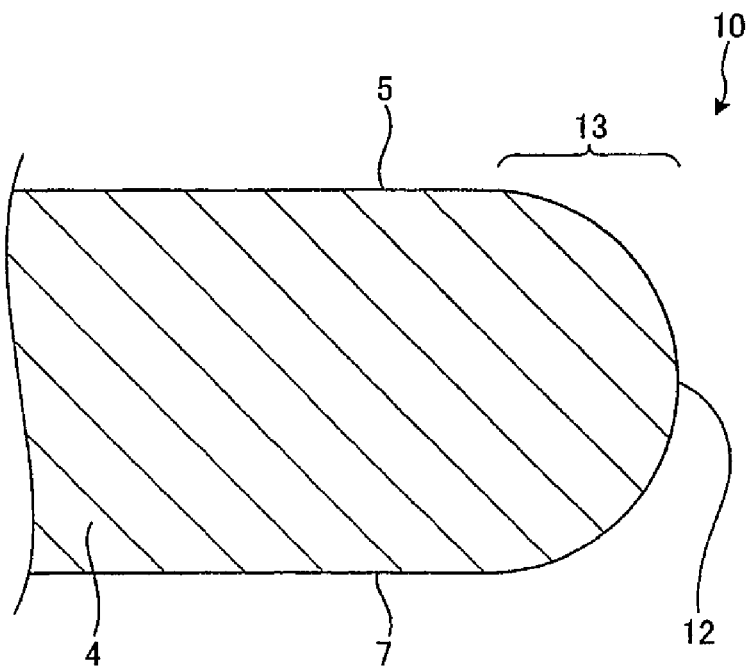
FIG. 3 is an enlarged cross-sectional view taken along line III-III of FIG. 2.

A method of manufacturing a molded chip according to a first embodiment of the present invention will be described below with reference to the drawings. FIG. 1 is a perspective view illustrating by way of example a molded chip manufactured by the method of manufacturing a molded chip according to the first embodiment. FIG. 2 is a perspective view illustrating by way of example a wafer from which the molded chip illustrated in FIG. 1 is manufactured. FIG. 3 is an enlarged cross-sectional view taken along line III-III of FIG. 2.

As illustrated in FIG. 1, a molded chip 1 according to the first embodiment includes a device chip 2 and a resin molding 3. As illustrated in FIG. 2, the device chip 2 includes a substrate 4 and a device 6 formed on a face side 5 of the substrate 4. The device 6 has a surface representing a device face. Therefore, the device chip 2 includes the device face on the face side 5 of the substrate 4. The device 6 is an electronic component such as an integrated circuit (IC), a large scale integration (LSI) circuit, or the like. The device chip 2 also includes a plurality of at least electrodes or electrode bumps, not illustrated, disposed on the device face for connecting the device face to a substrate or another device chip, not illustrated.

The resin molding 3 is made of an insulative synthetic resin and covers a reverse side 7 of the substrate 4 that is opposite the face side 5 on which the device 6 is disposed and side faces 8 contiguous to the face side 5 and the reverse side 7. According to the present embodiment, the resin molding 3 covers all the side faces 8.

The molded chip 1 of the structure described above is manufactured by dividing a wafer 10 illustrated in FIG. 2 into device chips 2 and covering the reverse side 7 and the side faces 8 of each of the device chips 2 with the resin molding 3. The wafer 10 to be divided into the device chips 2 may be a semiconductor wafer or an optical device wafer in the form of a circular plate with the substrate 4 being made of silicon, sapphire, gallium arsenide, or the like. The wafer 10 will be described using the same reference characters for components in common with the device chip 2. As illustrated in FIG. 2, the wafer 10 has devices 6 formed respectively in a plurality of areas demarcated on the face side 5 of the substrate 4 by a grid of projected dicing lines 11.

Furthermore, as illustrated in FIG. 3, the wafer 10 has an arcuate outer circumferential side face 12 that is protruded radially outwardly. The outer circumferential side face 12 of the wafer 10 has an arcuate cross-sectional shape where the center in thickness wise directions of the wafer 10 protrudes maximally in a radially outward direction. Stated otherwise, the wafer 10 has an arcuate portion 13 extending fully around an outer circumferential edge thereof.

Figure 4:
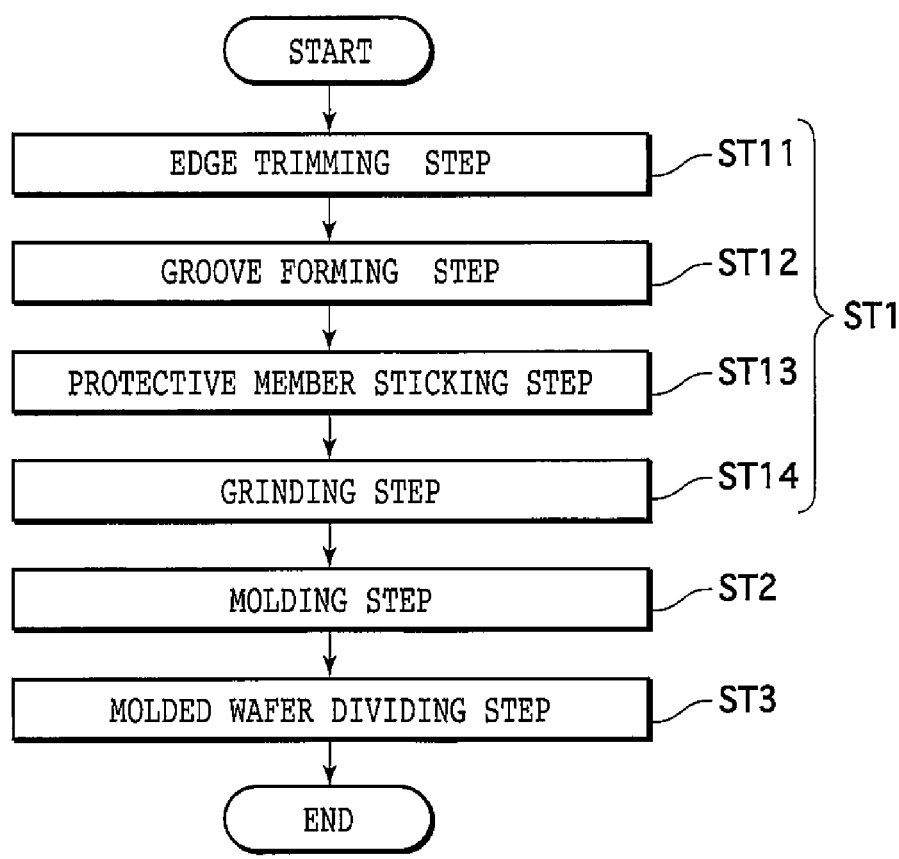
FIG. 4 is a flowchart illustrating the flow of the method of manufacturing a molded chip according to the first embodiment.

The method of manufacturing the molded chip 1 illustrated in FIG. 1 will be described below. FIG. 4 is a flowchart illustrating the flow of the method of manufacturing a molded chip according to the first embodiment.

According to the method of manufacturing a molded chip, the molded chip 1 is manufactured by dividing the wafer 10 into individual device chips 2 along the projected dicing lines 11 and covering the reverse side 7 and the side faces 8 of each of the device chips 2 with the resin molding 3. As illustrated in FIG. 4, the method of manufacturing a molded chip includes preparing step ST1, molding step ST2, and molded wafer dividing step ST3.

(Preparing Step)

Figure 5:
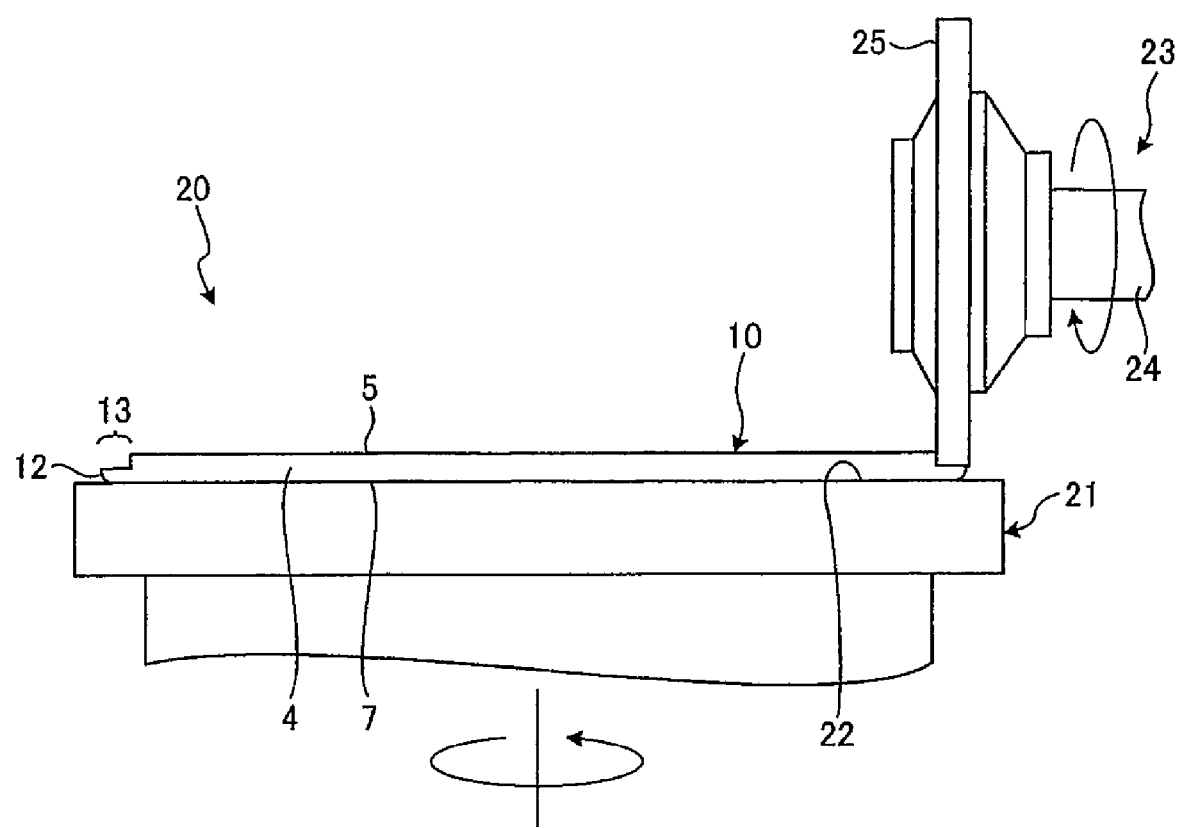
FIG. 5 is a schematic side elevational view illustrating an edge trimming step of a preparing step of the method of manufacturing a molded chip illustrated in FIG. 4.
Figure 6:
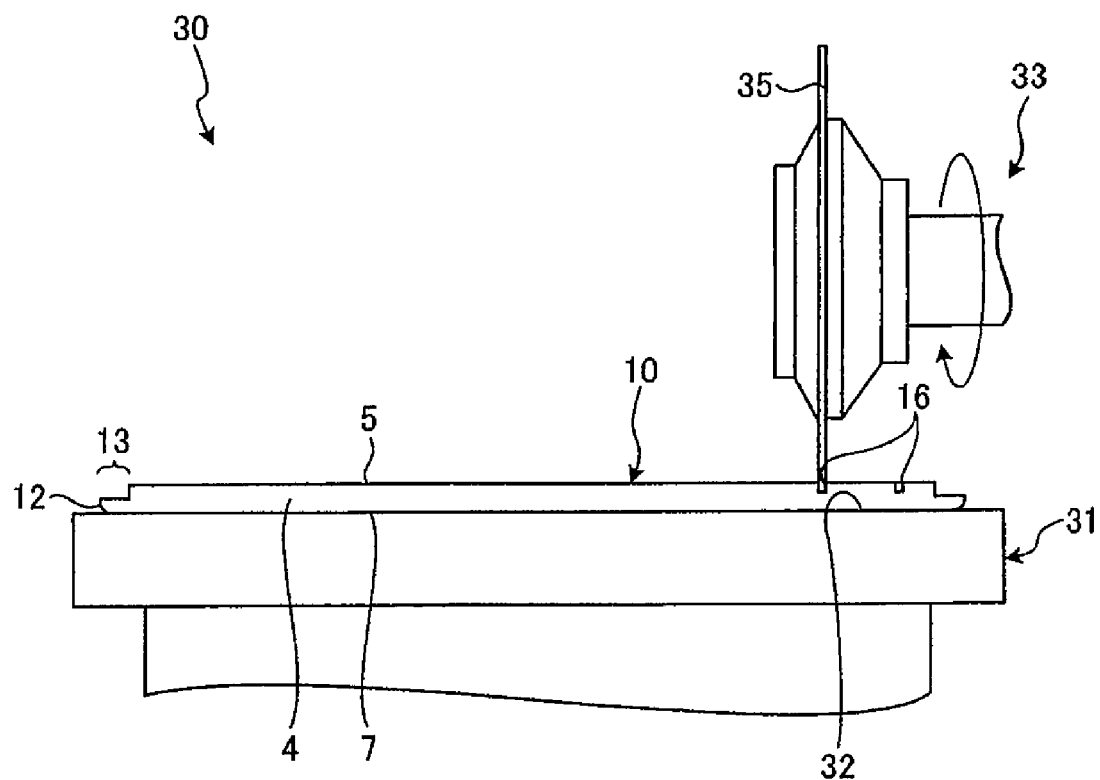
FIG. 6 is a schematic side elevational view illustrating a groove forming step of the preparing step of the method of manufacturing a molded chip illustrated in FIG. 4.
Figure 7:
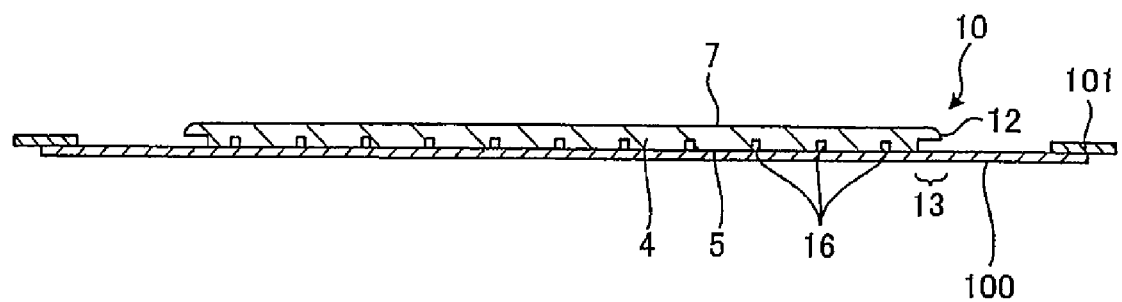
FIG. 7 is a schematic cross-sectional view of a wafer after a protective member sticking step of the preparing step of the method of manufacturing a molded chip illustrated in FIG. 4.
Figure 8:
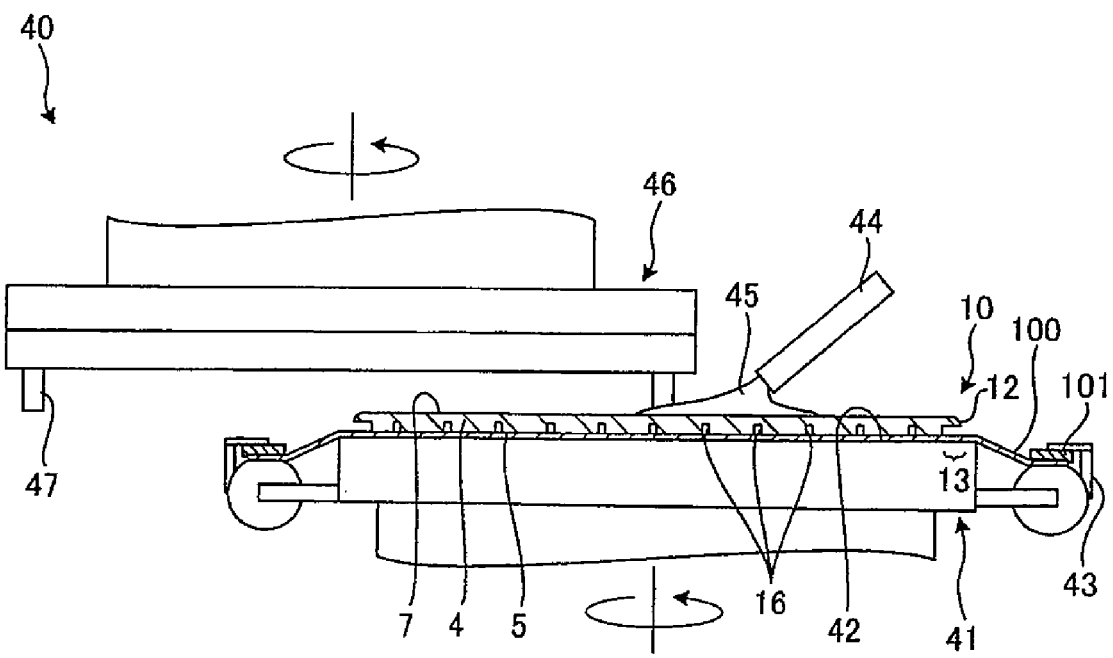
FIG. 8 is a schematic side elevational view, partly in cross section, illustrating a grinding step of the preparing step of the method of manufacturing a molded chip illustrated in FIG. 4.

FIG. 5 is a schematic side elevational view illustrating an edge trimming step of preparing step ST1 of the method of manufacturing a molded chip illustrated in FIG. 4. FIG. 6 is a schematic side elevational view illustrating a groove forming step of preparing step ST1 of the method of manufacturing a molded chip illustrated in FIG. 4. FIG. 7 is a schematic cross-sectional view of a wafer after a protective member sticking step of preparing step ST1 of the method of manufacturing a molded chip illustrated in FIG. 4. FIG. 8 is a schematic side elevational view, partly in cross section, illustrating a grinding step of preparing step ST1 of the method of manufacturing a molded chip illustrated in FIG. 4.

Preparing step ST1 is a step in which the device faces of a plurality of arrayed device chips 2 are stuck to a thermally insulative protective member 100 (see FIG. 9), producing a chip group 14 including the arrayed device chips 2. According to the first embodiment, as illustrated in FIG. 4, preparing step ST1 includes edge trimming step ST11, groove forming step ST12, protective member sticking step ST13, and grinding step ST14.

(Edge Trimming Step)

Edge trimming step ST11 is a step in which the arcuate portion 13 on the face side 5 of the wafer 10 is removed along the outer circumferential edge of the wafer 10. According to the first embodiment, in edge trimming step ST11, a cutting apparatus 20 (see FIG. 5) holds the reverse side 7 of the wafer 10 under suction on a holding surface 22 of a chuck table 21.

In edge trimming step ST11, the cutting apparatus 20 holds the reverse side 7 of the wafer 10 under suction on the holding surface 22 of the chuck table 21, and, as illustrated in FIG. 5, while rotating the chuck table 21 about an axis parallel to the vertical directions, moves a cutting blade 25 rotated by a spindle 24 of a cutting unit 23 to cut into the arcuate portion 13 on the outer circumferential edge of the wafer 10 from the face side 5 thereof to a depth in excess of a finished thickness 15 illustrated in FIG. 1, thereby removing the arcuate portion 13 on the face side 5. When the arcuate portion 13 has been removed from the face side 5 all along the outer circumferential edge of the wafer 10 in edge trimming step ST11, the method goes from edge trimming step ST11 to groove forming step S12. The finished thickness 15 is the same as the thickness of the wafer 10 thinned in grinding step ST14.

(Groove Forming Step)

Groove forming step ST12 is a step in which grooves 16 having a depth larger than the finished thickness 15 are formed in the face side 5 of the wafer 10 along the projected dicing lines 11 on the face side 5. In groove forming step S12, a cutting apparatus 30 (see FIG. 6) holds the reverse side 7 of the wafer 10 under suction on a holding surface 32 of a chuck table 31. An image capturing unit, not illustrated, captures an image of the face side 5 of the wafer 10, and an alignment process is performed to position a cutting blade 35 of a cutting unit 33 in alignment with one of the projected dicing lines 11 on the wafer 10 on the basis of the captured image.

In groove forming step ST12, as illustrated in FIG. 6, the cutting apparatus 30 relatively moves the wafer 10 and the cutting blade 35 along the projected dicing line 11 on the basis of the result of the alignment process while moving the cutting blade 35 to cut into the wafer 10 from the face side 5 along the projected dicing line 11 to a depth larger than the finished thickness 15, thereby forming a groove 16 in the wafer 10 to a depth larger than the finished thickness 15. In groove forming step ST12, the cutting apparatus 30 forms grooves 16 along all the projected dicing lines 11. Thereafter, the method goes from groove forming step ST12 to protective member sticking step ST13.

(Protective Member Sticking Step)

Protective member sticking step ST13 is a step in which a protective member 100 (see FIG. 7) as a wafer protecting member is stuck to the face side 5 of the wafer 10 with the grooves 16 formed therein. According to the first embodiment, a protective tape that is of a circular shape larger in diameter than the wafer 10 and that is thermally insulative and flexible is used as the protective member 100. The term "thermally insulative" used herein means that the protective member 100 has its properties remaining unchanged even though it is heated to a temperature reached when the reverse side 7 and the side faces 8 of each of the device chips 2 are covered with a molding resin 3 in molding step ST2.

According to the first embodiment, in protective member sticking step ST13, a known mounter holds the wafer 10 and an annular frame 101 (see FIG. 7) under suction on a holding surface of a chuck table, not illustrated, after which the protective member 100 is stuck to the face side 5 of the wafer 10 and the annular frame 101, as illustrated in FIG. 7. After protective member sticking step ST13, the wafer 10 is supported within the opening of the annular frame 101 by the protective member 100. When the protective member 100 has been stuck to the face side 5 of the wafer 10 and the annular frame 101 in protective member sticking step ST13, the method goes from protective member sticking step ST13 to grinding step ST14.

(Grinding Step)

Grinding step ST14 is a step in which the reverse side 7 of the wafer 10 is ground until the grooves 16 are exposed on the reverse side 7, dividing the wafer 10 into device chips 2. According to the present embodiment, in grinding step ST14, a grinding apparatus 40 (see FIG. 8) holds the face side 5 of the wafer 10 under suction on a holding surface 42 of a chuck table 41 with the protective member 100 interposed therebetween, and clamps the annular frame 101 in position with clamp members 43. In grinding step ST14, as illustrated in FIG. 8, the grinding apparatus 40 rotates the chuck table 41 about its own axis, and while supplying a grinding fluid 45 to the reverse side 7 of the wafer 10 from a grinding fluid nozzle 44, presses grinding stones 47 of a grinding unit 46 that is rotating about its own axis against the reverse side 7 of the wafer 10.

In grinding step ST14, the grinding apparatus 40 grinds the wafer 10 from the reverse side 7 to thin the wafer 10 down to the finished thickness 15. Since the grooves 16 deeper than the finished thickness 15 have been formed in the wafer 10 from the face side 5 in grinding step ST14, when the grinding apparatus 40 thins the wafer 10 down to the finished thickness 15, the grooves 16 are exposed on the reverse side 7, dividing the wafer 10 into individual device chips 2. At this time, gaps 17 (see FIG. 9) as wide as the grooves 16 are formed between adjacent ones of the device chips 2. In this manner, a chip group 14 including the device chips 2 with the protective member 100 stuck to their device faces is produced. When the wafer 10 has been thinned to the finished thickness 15 in grinding step ST14, the method goes from preparing step ST1 to molding step ST2.

(Molding Step)

Figure 9:
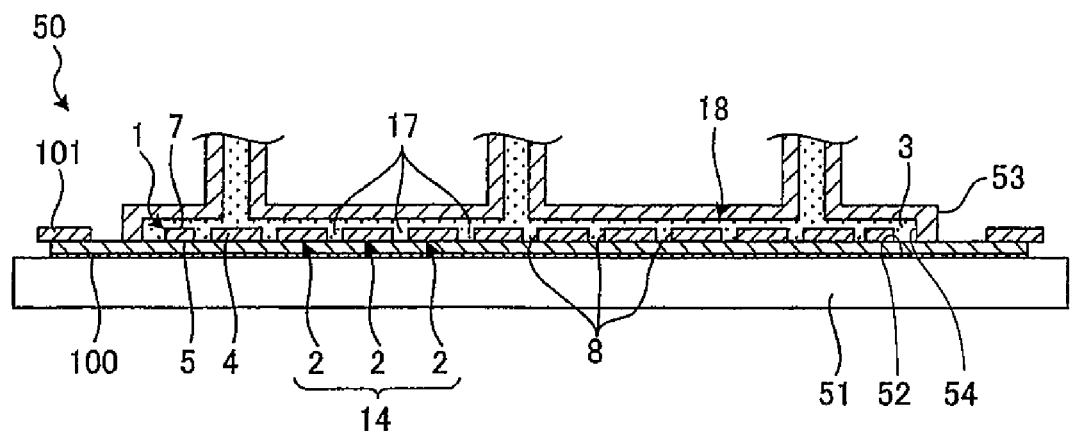
FIG. 9 is a schematic side elevational view illustrating a molding step of the method of manufacturing a molded chip illustrated in FIG. 4.

FIG. 9 is a schematic side elevational view illustrating a molding step of the method of manufacturing a molded chip illustrated in FIG. 4. Molding step ST2 is a step in which, after preparing step ST1, a molding resin 3 in a molten phase is supplied to gaps between the reverse sides 7 of the device chips 2, a mold 53, and also the gaps 17 between the device chips 2 to cover the reverse sides 7 and the side faces 8 of the device chips 2 with a resin molding 3, thereby forming a molded wafer 18. The molded wafer 18 is thicker than the wafer 10 that has been thinned to the finished thickness 15 in grinding step ST14 and is of a circular shape larger in diameter than the wafer 10.

According to the first embodiment, in molding step ST2, as illustrated in FIG. 9, the protective member 100 is held on a flat holding surface 52 of a table 51 of a molding machine 50, and all the device chips 2 stuck to the protective member 100 are covered with a mold 53 for molding a molded product. The mold 53 has a hollow cylindrical cavity 54 that is defined therein by wall surfaces spaced from the device chips 2 stuck to the protective member 100 and that is complementary in shape to the molded wafer 18.

In molding step ST2, a hopper, not illustrated, of the molding machine 50 is charged with pellets of the molding resin 3. Then, the molding machine 50 heats the pellets of the molding resin 3 in a heating cylinder, thereby melting the pellets. After being blended in the heating cylinder, the molding resin 3 is forced in a molten state into the cavity 54 in the mold 53 to fill the cavity 54. In molding step ST2, the molding resin 3 forced into the cavity 54 and supplied to the reverse side 7 of the wafer 10 is pressed against the reverse sides 7 of the device chips 2 by the molding machine 50 to cover the reverse sides 7 and the side faces 8, and then is hardened into a resin molding 3. When the molding resin 3 in the cavity 54 has been hardened into the resin molding 3 in molding step ST2, the method goes from molding step ST2 to molded wafer dividing step ST3. In molding step ST2, alternatively, a chip group of arrayed device chips 2 may be immersed in a molding resin in a molten phase to form a layer of resin molding 3 on the device chips 2, or a chip group of arrayed device chips 2 may be laminated by a film of molding resin to form a layer of resin molding 3 on the device chips 2.

(Molded Wafer Dividing Step)

Figure 10:
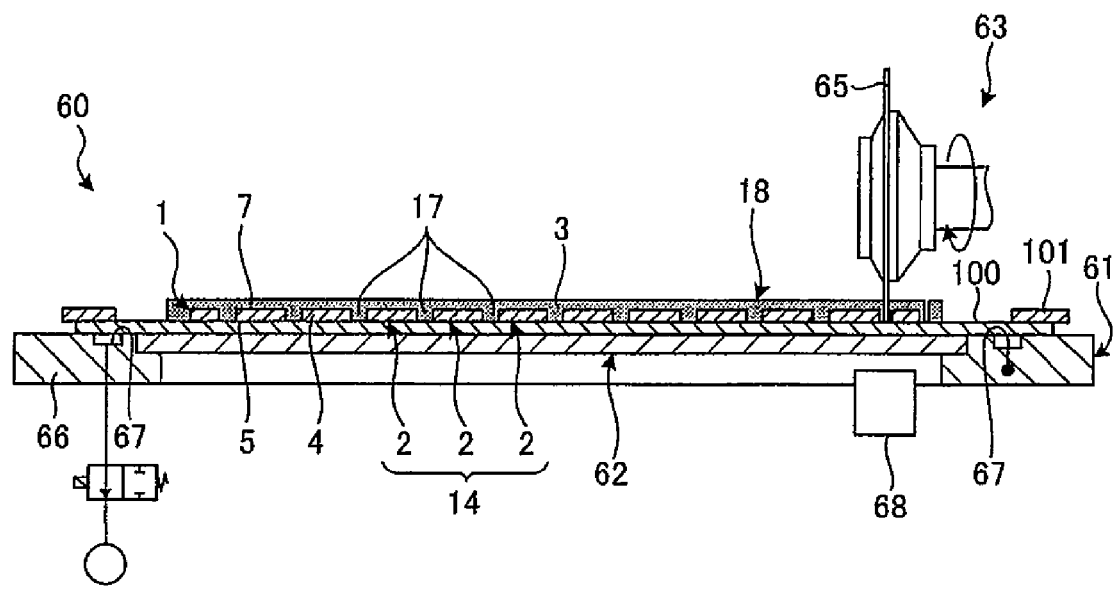
FIG. 10 is a schematic cross-sectional view illustrating a molded wafer dividing step of the method of manufacturing a molded chip illustrated in FIG. 4.

FIG. 10 is a schematic cross-sectional view illustrating a molded wafer dividing step of the method of manufacturing a molded chip illustrated in FIG. 4. Molded wafer dividing step ST3 is a step in which, after molding step ST2, the molded wafer 18 is divided into molded chips 1 along the centers of the gaps 17 filled with the resin molding 3 on the basis of a captured image of the face side 5 of the molded wafer 18.

In molded wafer dividing step ST3, a cutting apparatus 60 places a central area of the protective member 100 stuck to the face sides 5 of the device chips 2 on a circular light transmissive plate 62, made of a light transmissive material such as glass or the like, of a chuck table 61, and places an outer edge of the protective member 100 stuck to the annular frame 101 on an annular frame 66, made of stainless steel or the like, of the chuck table 61. In molded wafer dividing step ST3, the cutting apparatus 60 holds the outer edge of the protective member 100 on the frame 66 under suction forces applied to the outer edge of the protective member 100 through a suction port 67 defined in the frame 66. An image capturing unit 68 disposed beneath the light transmissive plate 62 captures an image of the face sides 5 of the device chips 2 of the molded wafer 18 through the light transmissive plate 62.

In molded wafer dividing step ST3, the cutting apparatus 60 performs an alignment process to position a cutting blade 65 of a cutting unit 63 in alignment with the transverse center of a row of gaps 17 along one of the projected dicing lines 11 on the basis of the captured image of the face sides 5 of the device chips 2. Then, as illustrated in FIG. 10, the cutting apparatus 60 relatively moves the molded wafer 18 and the cutting blade 65 along the projected dicing line 11 on the basis of the result of the alignment process while moving the cutting blade 65 to cut into the molded wafer 18 at the center of the row of gaps 17 from the resin molding 3 side, i.e., the reverse side 7, until the cutting blade 65 reaches the protective member 100, thereby dividing the molded wafer 18 into molded chips 1. Molded wafer dividing step ST3 ends when the cutting apparatus 60 moves the cutting blade 65 to cut into the molded wafer 18 at the centers of rows of gaps 17 along all the projected dicing lines 11, dividing the molded wafer 18 into molded chips 1. The individually divided molded chips 1 are picked up from the protective member 100 by a known picker. The cutting blade 65 used in molded wafer dividing step ST3 is thinner than the width of each of the gaps 17.

The method of manufacturing a molded chip according to the first embodiment includes groove forming step ST12 for forming the grooves 16 to a depth larger than the finished thickness 15 in the face side 5 of the wafer 10, protective member sticking step ST13 for sticking the protective member 100 to the face side 5 of the wafer 10, and grinding step ST14 for thinning the wafer 10 from the reverse side 7 to the finished thickness 15, thereby dividing the wafer 10 into the individual device chips 2 while being stuck to the protective member 100. The method of manufacturing a molded chip further includes molding step ST2 for covering the reverse sides 7 and the side faces 8 of the device chips 2 on the protective member 100 with the resin molding 3.

Therefore, the method of manufacturing a molded chip allows the reverse sides 7 and the side faces 8 of the device chips 2 to be covered with the resin molding 3 while the devices 6 on the wafer 10 are being kept in relative positions. As a result, the method of manufacturing the molded chip 1 is advantageous in that electrodes and electrode bumps on the device faces are prevented from being contaminated by the resin molding 3 and electric connections of the devices 6 are secured.

Moreover, in the method of manufacturing a molded chip, preparing step ST1 includes edge trimming step ST11 for removing the arcuate portion 13 on the face side 5 of the wafer 10. Consequently, after grinding step ST14, the wafer 10 is free of an outer circumferential knife edge that would otherwise remain unremoved outwardly of the device chips 2 on an outermost circumferential area if the arcuate portion 13 were thinned. The method of manufacturing a molded chip according to the first embodiment is thus able to prevent the device chips 2 near the outer circumferential edge of the wafer 10 from being tilted by an outer circumferential knife edge when the molding resin 3 in the molten state is pressed against the reverse side 7 of the wafer 10 in the course of filling the cavity 54. As a result, the method of manufacturing a molded chip according to the first embodiment prevents the device chips 2 from being positionally shifted or otherwise adversely affected when the device chips 2 are covered with the molding resin 3 in the molten state.

In the method of manufacturing a molded chip according to the first embodiment, since the cutting blade 35 cuts into the wafer 10 from the reverse side 7 in groove forming step ST12, and the cutting blade 65 cuts into the molded wafer 18 from the resin molding 3 side in molded wafer dividing step ST3, debris or chips produced in groove forming step ST12 and molded wafer dividing step S3 are prevented from being deposited on the device faces. According to the present invention, furthermore, molded wafer dividing step ST3 may be carried out by an ablation process or a modified layer forming process in which a laser beam having a wavelength that can be absorbed by or transmitted through the resin molding 3 is applied to the resin molding 3.

Second Embodiment

Figure 11:
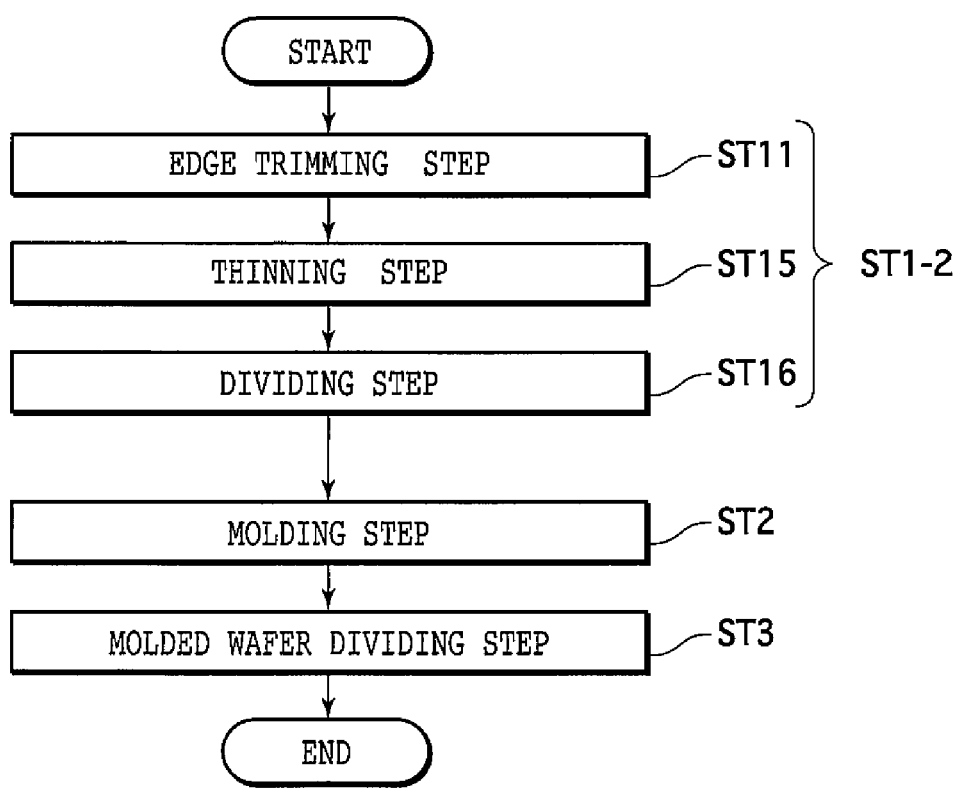
FIG. 11 is a flowchart illustrating the flow of a method of manufacturing a molded chip according to a second embodiment of the present invention.
Figure 12:
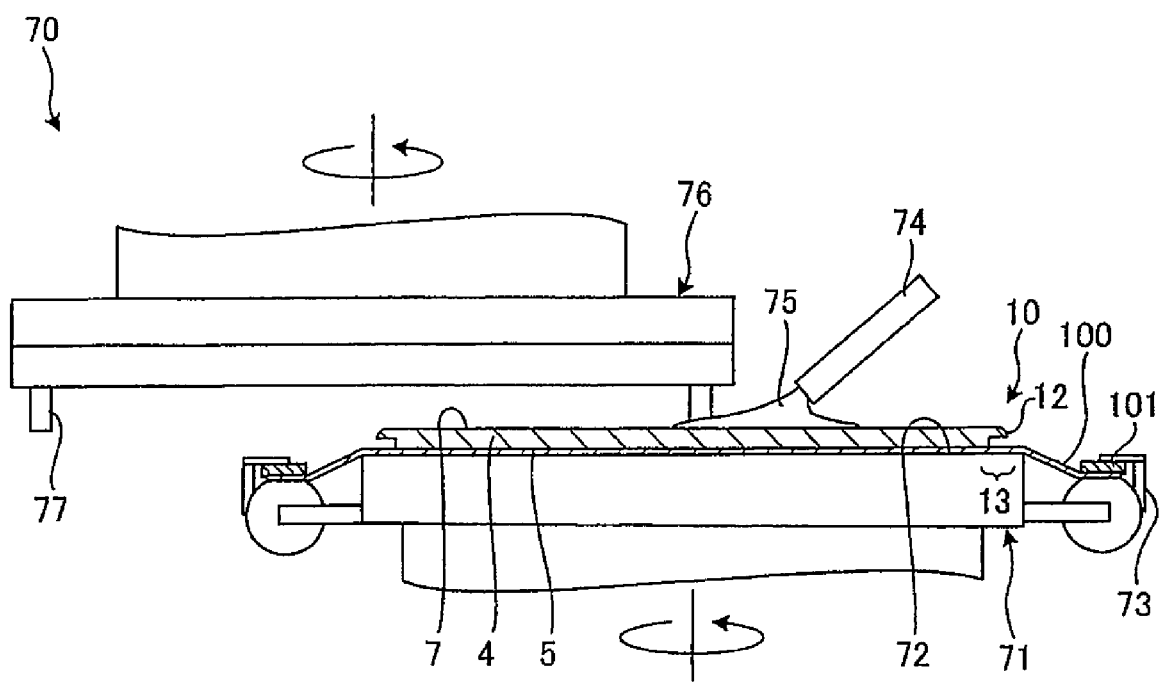
FIG. 12 is a schematic side elevational view, partly in cross section, illustrating a thinning step of a preparing step of the method of manufacturing a molded chip illustrated in FIG. 11.
Figure 13:
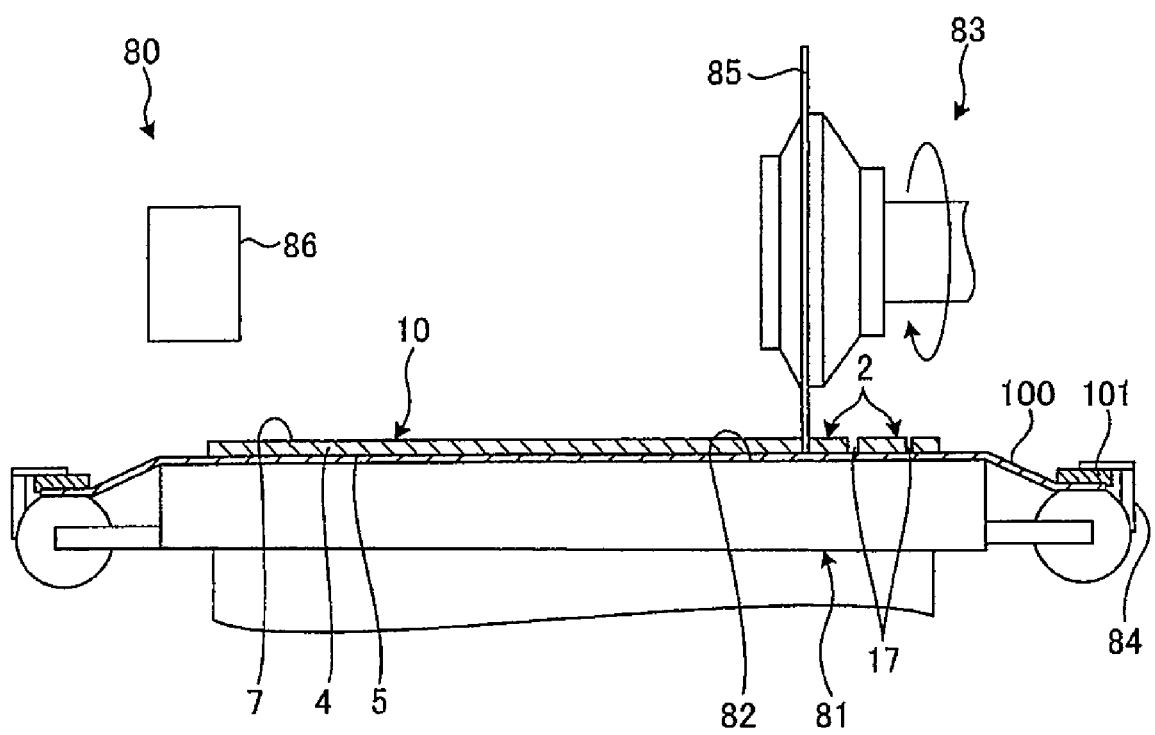
FIG. 13 is a schematic side elevational view, partly in cross section, illustrating a dividing step of the preparing step of the method of manufacturing a molded chip illustrated in FIG. 11.

A method of manufacturing a molded chip according to a second embodiment of the present invention will be described below with reference to the drawings. FIG. 11 is a flowchart illustrating the flow of the method of manufacturing a molded chip according to the second embodiment. FIG. 12 is a schematic side elevational view, partly in cross section, illustrating a thinning step of a preparing step of the method of manufacturing a molded chip illustrated in FIG. 11. FIG. 13 is a schematic side elevational view, partly in cross section, illustrating a dividing step of the preparing step of the method of manufacturing a molded chip illustrated in FIG. 11. In FIGS. 11 through 13, those parts which are identical to those according to the first embodiment are denoted by identical reference characters, and will not be described in detail below.

The method of manufacturing a molded chip according to the second embodiment is a method of manufacturing a device chip 1 as is the case with the first embodiment. As illustrated in FIG. 11, the method of manufacturing a molded chip according to the second embodiment includes preparing step ST1-2, molding step ST2, and molded wafer dividing step ST3, and preparing step ST1-2 includes edge trimming step ST11, thinning step ST15, and dividing step ST16.

(Thinning Step)

Thinning step ST15 is a step in which the reverse side 7 of the wafer 10 is ground to thin the wafer 10 to a finished thickness 15. According to the second embodiment, in thinning step ST15, the protective member 100 is stuck to the face side 5 of the wafer 10 after edge trimming step ST11, and the annular frame 101 is stuck to the outer edge of the protective member 100. In thinning step ST15, a grinding apparatus 70 (see FIG. 12) holds the face side 5 of the wafer 10 after edge trimming step ST11 under suction on a holding surface 72 of a chuck table 71 with the protective member 100 interposed therebetween, and clamps the annular frame 101 in position with clamp members 73. In thinning step ST15, as illustrated in FIG. 12, the grinding apparatus 70 rotates the chuck table 71 about its own axis, and while supplying a grinding fluid 75 to the reverse side 7 of the wafer 10 from a grinding fluid nozzle 74, presses grinding stones 77 of a grinding unit 76 that is rotating about its own axis against the reverse side 7 of the wafer 10.

In thinning step ST15, the grinding apparatus 70 grinds the wafer 10 from the reverse side 7 to thin the wafer 10 down to the finished thickness 15. Since the arcuate portion 13 of the wafer 10 has been removed to a depth larger than the finished thickness 15 from the face side 5 in edge trimming step ST11, when the grinding apparatus 70 thins the wafer 10 down to the finished thickness 15, the arcuate portion 13 is fully removed. When the wafer 10 has been thinned to the finished thickness 15 in thinning step ST15, the method goes from thinning step ST15 to dividing step ST16.

(Dividing Step)

Dividing step ST16 is a step in which the thinned wafer 10 is divided along the projected dicing lines 11. In dividing step ST16, a cutting apparatus 80 (see FIG. 13) holds the face side 5 of the wafer 10 under suction on a holding surface 82 of a chuck table 81 with the protective member 100 interposed therebetween, and clamps the annular frame 101 in position with clamp members 84. In dividing step ST16, as illustrated in FIG. 13, the cutting apparatus 80 captures an image of the reverse side 7 of the wafer 10 with an infrared camera 86, detects one of the projected dicing lines 11, and performs an alignment process to position a cutting blade 85 of a cutting unit 83 in alignment with the projected dicing line 11 on the wafer 10 on the basis of the captured image.

In dividing step ST16, as illustrated in FIG. 13, the cutting apparatus 80 relatively moves the wafer 10 and the cutting blade 85 along the projected dicing line 11 on the basis of the result of the alignment process while moving the cutting blade 85 to cut into the wafer 10 from the reverse side 7 along the projected dicing line 11, thereby dividing the wafer 10 into individual device chips 2. When the cutting apparatus 80 has moved the cutting blade 85 to cut into the wafer 10 along all the projected dicing lines 11, dividing the wafer 10 into individual device chips 2 and forming gaps 17 between the device chips 2 in dividing step ST16, preparing step ST1 ends. The method then goes from preparing step ST1 to molding step ST2.

The method of manufacturing a device chip according to the second embodiment includes thinning step ST15 for sticking the protective member 100 to the face side 5 of the wafer 10 and thinning the wafer 10 to the finished thickness 15 and the dividing step ST16 for dividing the wafer 10 into individual device chips 2, thereby dividing the wafer 10 into the individual device chips 2 while being stuck to the protective member 100. As a result, the method of manufacturing a molded chip allows the reverse sides 7 and the side faces 8 of the device chips 2 to be covered with the resin molding 3 while the devices 6 on the wafer 10 are being kept in relative positions. The method of manufacturing a molded chip is advantageous in that electrodes and electrode bumps on the device faces are prevented from being contaminated by the resin molding 3 and electric connections of the devices 6 are secured.

Moreover, in the method of manufacturing a molded chip according to the first embodiment, preparing step ST1 includes edge trimming step ST11 for removing the arcuate portion 13 on the face side 5 of the wafer 10. Consequently, after grinding step ST14, the wafer 10 is free of an outer circumferential knife edge that would otherwise remain unremoved outwardly of the device chips 2 on an outermost circumferential area if the arcuate portion 13 were thinned. The method of manufacturing a molded chip according to the second embodiment is thus able to prevent the device chips 2 from being positionally shifted or otherwise adversely affected when the device chips 2 are covered with the molding resin 3 in the molten state.

In the method of manufacturing a molded chip according to the second embodiment, since the cutting blade 85 cuts into the wafer 10 from the reverse side 7 in dividing step ST16, and the cutting blade 65 cuts into the molded wafer 18 from the resin molding 3 side in molded wafer dividing step ST3, debris or chips are prevented from being deposited on the device faces.

First Modification

Figure 14:
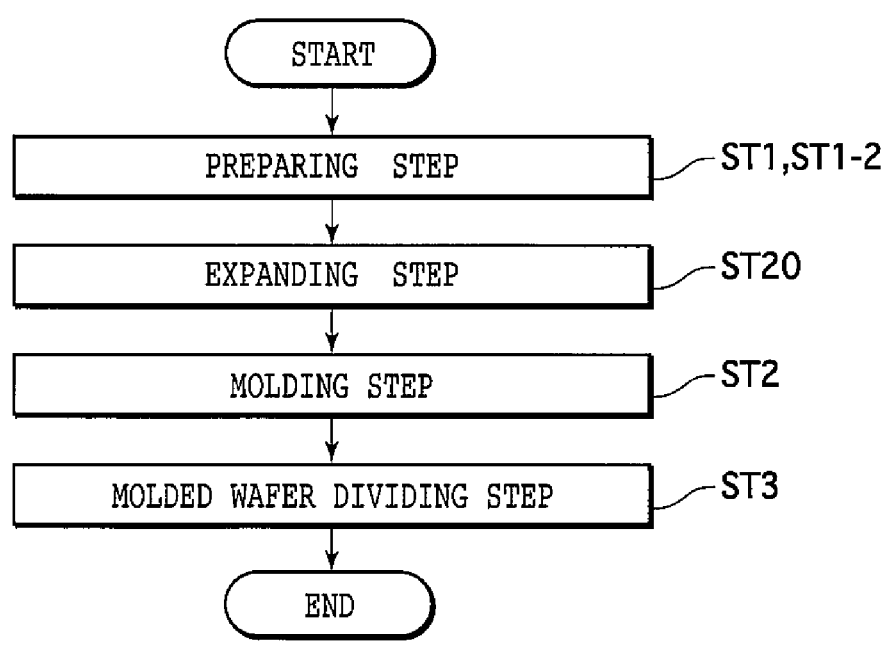
FIG. 14 is a flowchart illustrating the flow of a method of manufacturing a molded chip according to a first modification of the first and second embodiments.
Figure 15:
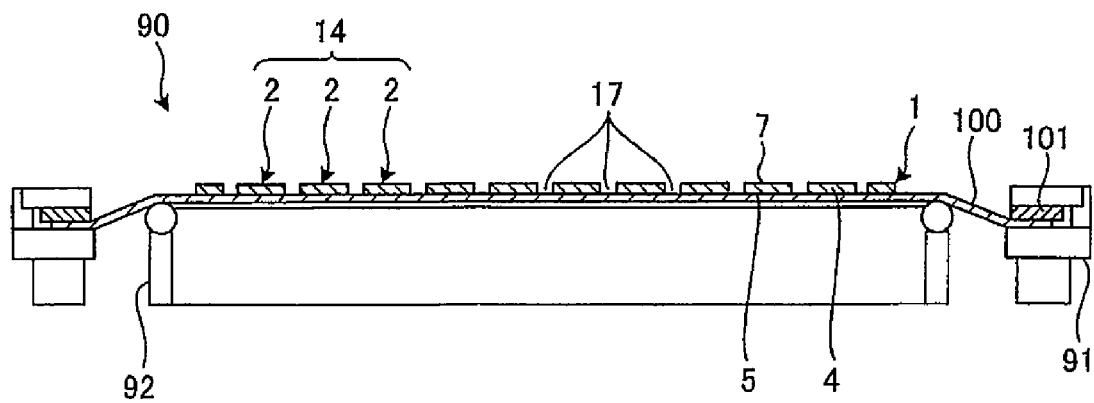
FIG. 15 is a schematic cross-sectional view illustrating the manner in which a plurality of individually divided device chips are held on an expanding apparatus in an expanding step of the method of manufacturing a molded chip illustrated in FIG. 14.
Figure 16:
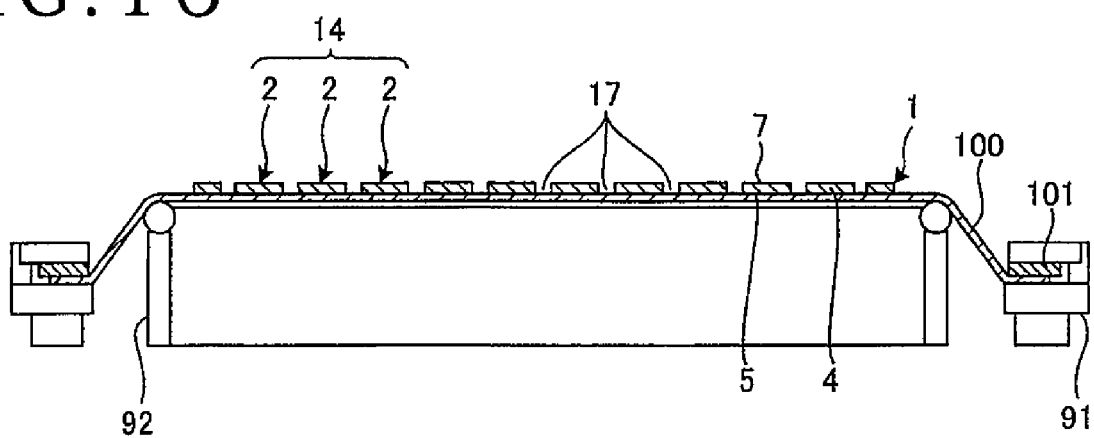
FIG. 16 is a schematic cross-sectional view illustrating the manner in which a protective member illustrated in FIG. 15 is expanded.
Figure 17:
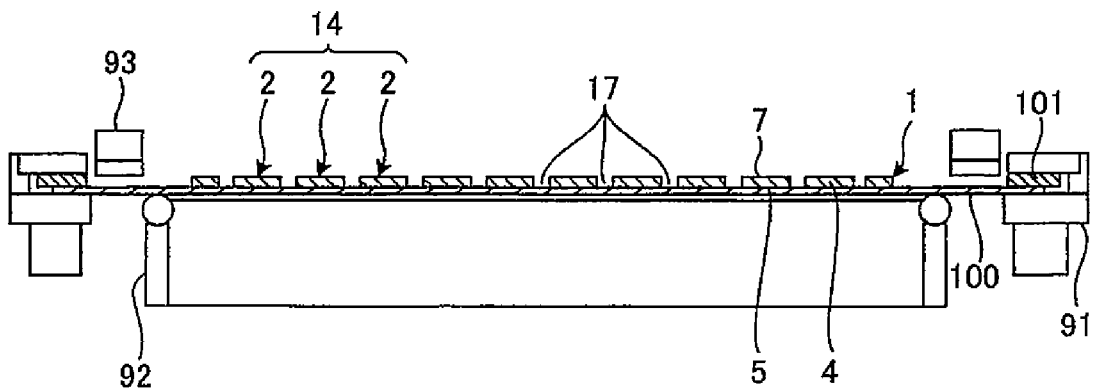
FIG. 17 is a schematic cross-sectional view illustrating the manner in which the spacing between the device chips on the protective member illustrated in FIG. 16 and an annular frame is shrunk.

A method of manufacturing a molded chip according to a first modification of the first and second embodiments of the present invention will be described below with reference to the drawings. FIG. 14 is a flowchart illustrating the flow of a method of manufacturing a molded chip according to a first modification of the first and second embodiments. FIG. 15 is a schematic cross-sectional view illustrating the manner in which a plurality of individually divided device chips are held on an expanding apparatus in an expanding step of the method of manufacturing a molded chip illustrated in FIG. 14. FIG. 16 is a schematic cross-sectional view illustrating the manner in which a protective member illustrated in FIG. 15 is expanded. FIG. 17 is a schematic cross-sectional view illustrating the manner in which the spacing between the device chips on the protective member illustrated in FIG. 16 and an annular frame is shrunk. In FIGS. 15 through 17, those parts which are identical to those according to the first and second embodiments are denoted by identical reference characters, and will not be described in detail below.

As illustrated in FIG. 14, the method of manufacturing a molded chip according to the first modification is the same as the method of manufacturing a molded chip according to the first embodiment or the second embodiment except that the protective member 100 is stretchable and the method includes expanding step ST20. Expanding step ST20 is a step in which the protective member 100 is expanded in planar directions to expand the distances between the device chips 2.

In expanding step ST20, an expanding apparatus 90 (see FIG. 9) holds a plurality of device chips 2 stuck to the protective member 100 with the reverse sides 7 of the device chips 2 facing upwardly, by sandwiching the annular frame 101 with clamp members 91. At this time, as illustrated in FIG. 15, the expanding apparatus 90 keeps the protective member 100 flatwise by having a hollow cylindrical expanding drum 92 in abutment against an area of the protective member 100 that lies between the wafer 10 and the annular frame 101. The expanding drum 92 has inside and outside diameters smaller than the inside diameter of the annular frame 101 and larger than the outside diameter of the wafer 10, and is disposed in a position coaxial with the annular frame 101 fixed by the clamp members 91.

According to the first modification, in expanding step ST20, as illustrated in FIG. 16, the expanding apparatus 90 elevates the expanding drum 92. Since the protective member 100 is in abutment against the expanding drum 92, the protective member 100 is expanded in planar directions, and radial tensile forces act on the protective member 100 as a result of the expansion thereof.

When the radial tensile forces act on the protective member 100, inasmuch as the wafer 10 has been divided into the individual device chips 2, the distance between adjacent ones of the device chips 2 is widened. According to the first modification, the expanding drum 92 is lifted to expand the protective member 100 in expanding step ST20. However, the present invention is not limited to such an expanding fashion. Instead, the clamp members 91 may be lowered. Stated otherwise, the expanding drum 92 may be relatively lifted with respect to the clamp members 91 or the clamp members 91 may be relatively lowered with respect to the expanding drum 92.

According to the first modification, in expanding step ST20, the expanding apparatus 90 then lowers the expanding drum 92, and as illustrated in FIG. 17, heats and shrinks the slacked portion of the protective member 100 that has been created between the wafer 10 and the annular frame 101 as a result of the expansion of the protective member 100, with a heating unit 93. In expanding step ST20, the expanding apparatus 90 heats and shrinks the slacked portion of the protective member 100 that has been created between the wafer 10 and the annular frame 101, keeping the spacing between the adjacent ones of the device chips 2 at the time when the protective member 100 is expanded. Expanding step ST20 ends when the expanding apparatus 90 has heated and shrunk the slacked portion of the protective member 100 between the wafer 10 and the annular frame 101. Then, the method goes from expanding step ST20 to molding step ST2. According to the present invention, the slacked portion may be removed or canceled by re-sticking the protective member 100 to a smaller-diameter frame, for example, rather than heating the protective member 100.

In the method of manufacturing a molded chip according to the first modification, since the distance between adjacent ones of the device chips 2 is widened by expanding the protective member 100 stuck to the wafer 10, the gaps 17 between the device chips 2 can easily be filled with the molding resin 3 in molding step ST2. As a result, the method of manufacturing a molded chip according to the first modification has an advantage in that the side faces 8 of the device chips 2 can be covered with a resin molding 3 having an appropriate thickness, as well as the advantages of the first and second embodiments. According to the first modification, the expanding drum 92 is used in expanding step ST20. However, the present invention is not limited to using the expanding apparatus 90 including the expanding drum 92, but may use other expanding mechanisms as long as they can expand the protective member 100 in planar directions. According to the present invention, furthermore, rather than partly cutting the wafer 10 with the cutting blade 35, a laser beam having a wavelength that can be transmitted through the wafer 10 may be applied to the wafer 10 along the projected dicing lines 11 to form modified layers acting as fracture initiating points in the wafer 10 and then the reverse side 7 of the wafer 10 may be ground, thereby forming a chip group of arrayed device chips 2 according to a stealth dicing before grinding (SDBG) process, so that the device chips 2 can be covered with the resin molding 3.

Second Modification

Figure 18:
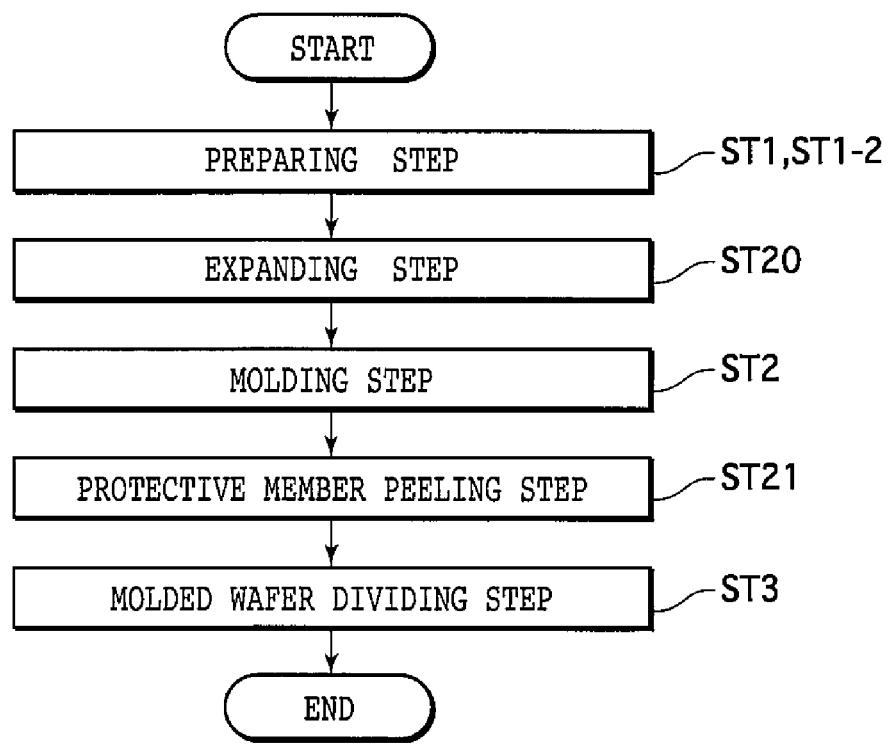
FIG. 18 is a flowchart illustrating the flow of a method of manufacturing a molded chip according to a second modification of the first and second embodiments.
Figure 19:
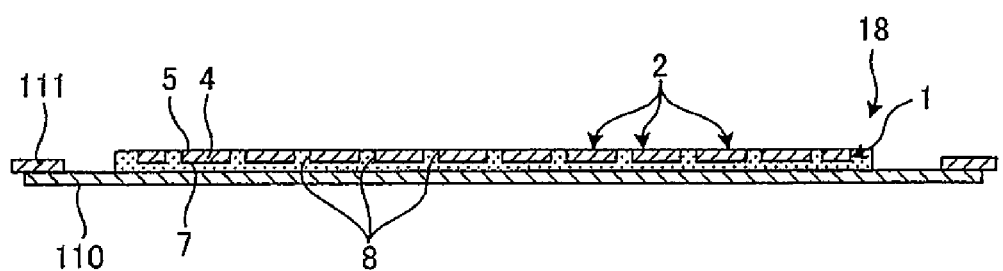
FIG. 19 is a schematic cross-sectional view illustrating a molded wafer, etc. after a protective member peeling step of the method of manufacturing a molded chip illustrated in FIG. 18.
Figure 20:
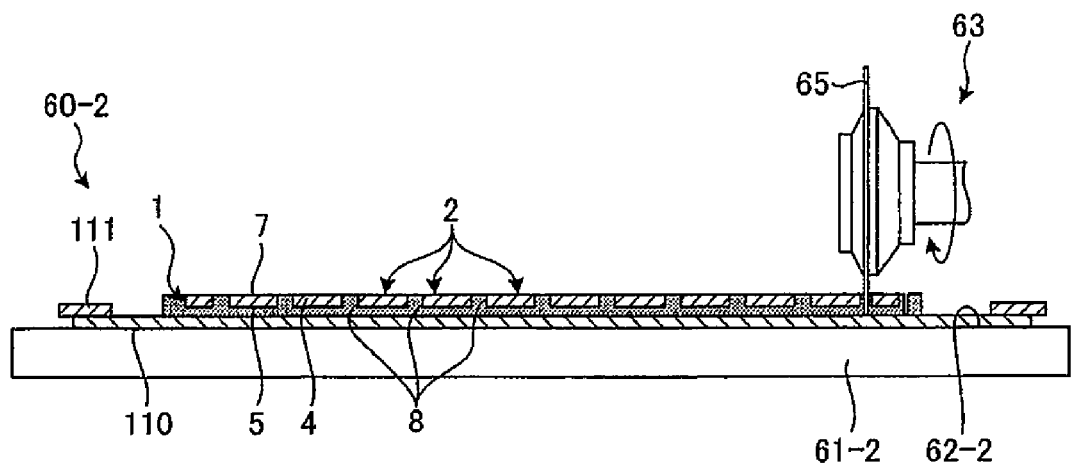
FIG. 20 is a schematic side elevational view, partly in cross section, illustrating a molded wafer dividing step of the method of manufacturing a molded chip illustrated in FIG. 18.

A method of manufacturing a molded chip according to a second modification of the first and second embodiments of the present invention will be described below with reference to the drawings. FIG. 18 is a flowchart illustrating the flow of the method of manufacturing a molded chip according to the second modification of the first and second embodiments. FIG. 19 is a schematic cross-sectional view illustrating a molded wafer, etc. after a protective member peeling step of the method of manufacturing a molded chip illustrated in FIG. 18. FIG. 20 is a schematic side elevational view, partly in cross section, illustrating a molded wafer dividing step of the method of manufacturing a molded chip illustrated in FIG. 18. In FIGS. 18 through 20, those parts which are identical to those according to the first and second embodiments and the first modification are denoted by identical reference characters, and will not be described in detail below.

As illustrated in FIG. 18, the method of manufacturing a molded chip according to the second modification is the same as the method of manufacturing a molded chip according to the first embodiment, the second embodiment, or the first modification except that the method includes protective member peeling step ST21 and molded wafer dividing step ST3 is different. As illustrated in FIG. 18, the method of manufacturing a molded chip according to the second modification includes expanding step ST20. According to the present invention, however, expanding step ST20 may be dispensed with.

Protective member peeling step ST21 is a step in which, after molding step ST2, an adhesive tape 110 is stuck to the reverse side 7 of the molded wafer 18 and the protective member 100 is peeled off from the face side 5 of the molded wafer 18. According to the second modification, in protective member peeling step ST21, as illustrated in FIG. 19, the adhesive tape 110 that is larger in diameter than the molded wafer 18 and has an annular frame 111 mounted on an outer edge thereof is stuck to the reverse side 7 of the molded wafer 18, and the protective member 100 is peeled off. Then, the method goes from protective member peeling step ST21 to molded wafer dividing step ST3. The adhesive tape 110 may be thermally insulative and stretchable as with the protective member 100, or may not be thermally insulative and stretchable.

According to the second modification, in molded wafer dividing step ST3, a cutting apparatus 60-2 (see FIG. 20) holds the reverse side 7 of the molded wafer 18 under suction on a holding surface 62-2 of a chuck table 61-2 with the adhesive tape 110 interposed therebetween, captures an image of the face side 5 of the molded wafer 18 with an image capturing unit, not illustrated, and performs an alignment process. According to the second modification, in molded wafer dividing step ST3, as illustrated in FIG. 20, the cutting apparatus 60-2 moves the cutting blade 65 to cut into the molded wafer 18 at the transverse center of a row of gaps 17 along one of the projected dicing lines 11 from the face side 5 of the molded wafer 18 down to the adhesive tape 110 on the basis of the captured image, thereby dividing the molded wafer 18 into individual device chips 2.

Inasmuch as the method of manufacturing a molded chip according to the second modification allows the reverse sides 7 and the side faces 8 of the device chips 2 to be covered with the resin molding 3 while the devices 6 of the molded wafer 18 are being kept in relative positions, the method of manufacturing a molded chip according to the second modification is advantageous in that electrodes and electrode bumps on the device faces are prevented from being contaminated by the resin molding 3 and electric connections of the devices 6 are secured, as with the first and second embodiments.

Third Modification

Figure 21:
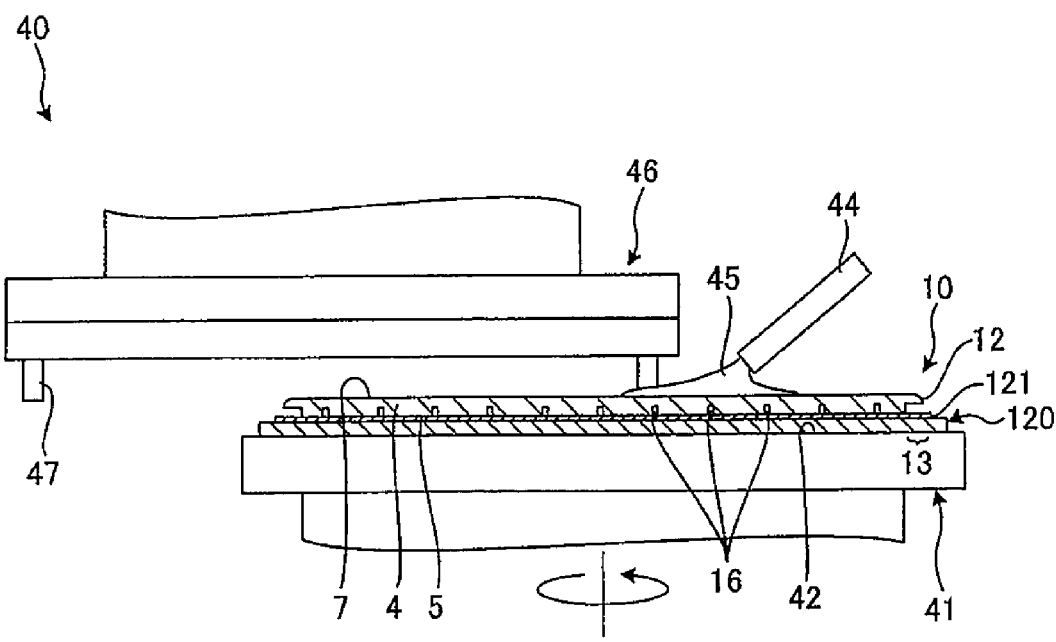
FIG. 21 is a schematic side elevational view, partly in cross section, illustrating a grinding step of a method of manufacturing a molded chip according to a third modification of the first embodiment.
Figure 22:
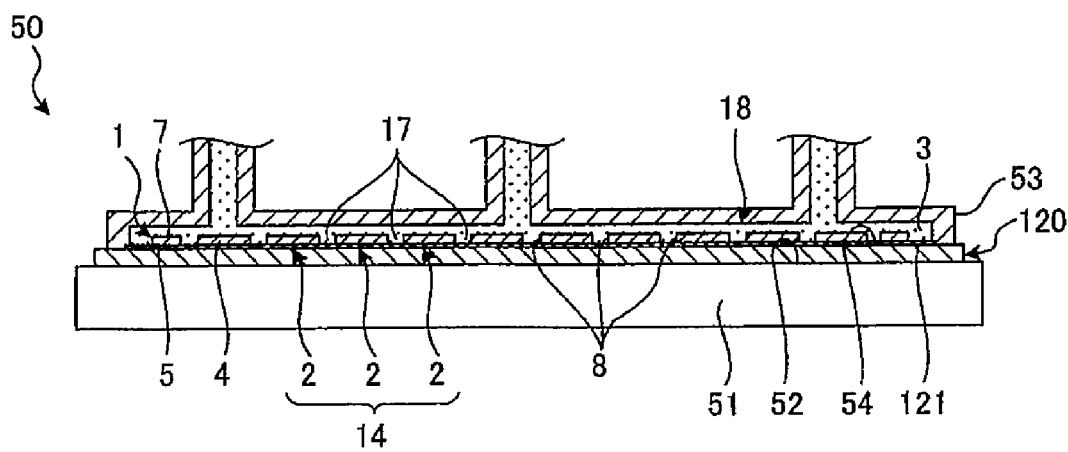
FIG. 22 is a schematic cross-sectional view illustrating a molding step of the method of manufacturing a molded chip according to the third modification of the first embodiment.
Figure 23:
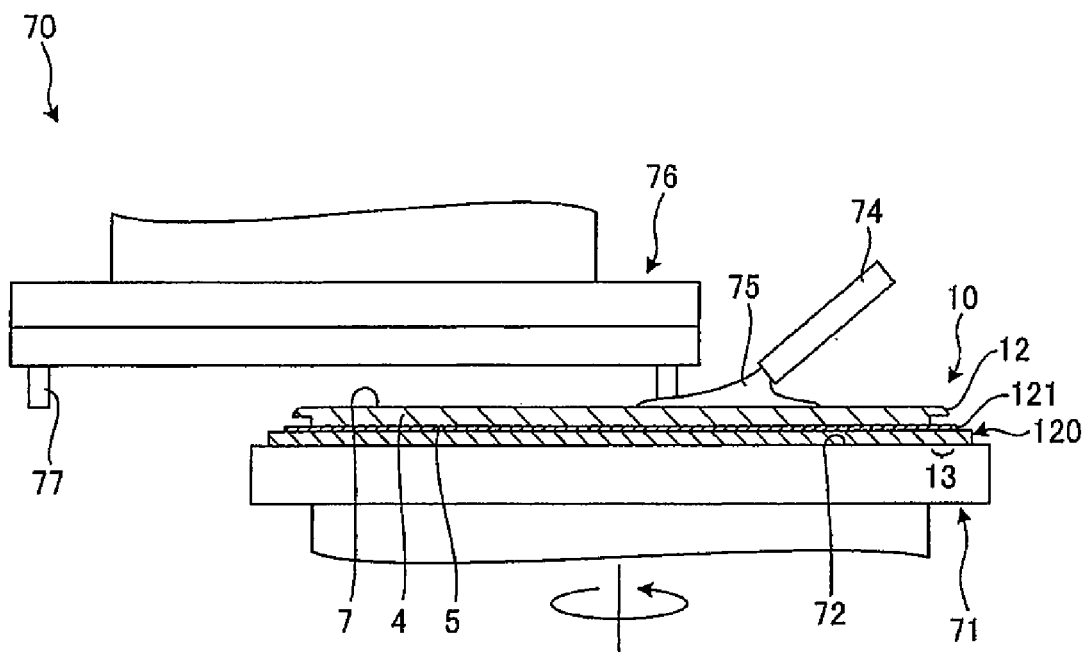
FIG. 23 is a schematic side elevational view, partly in cross section, illustrating a thinning step of a method of manufacturing a molded chip according to a third modification of the second embodiment.

A method of manufacturing a molded chip according to a third modification of the first and second embodiments of the present invention will be described below with reference to the drawings. FIG. 21 is a schematic side elevational view, partly in cross section, illustrating a grinding step of the method of manufacturing a molded chip according to the third modification of the first embodiment. FIG. 22 is a schematic cross-sectional view illustrating a molding step of the method of manufacturing a molded chip according to the third modification of the first embodiment. FIG. 23 is a schematic side elevational view, partly in cross section, illustrating a thinning step of the method of manufacturing a molded chip according to the third modification of the second embodiment.

The method of manufacturing a molded chip according to the third modification is the same as the method of manufacturing a molded chip according to the first embodiment or the second embodiment except that, as illustrated in FIGS. 21, 22, and 23, a protective member 120 is not a protective tape that is thermally insulative and flexible, but a hard substrate made of a hard material. FIGS. 21, 22, and 23 illustrate grinding step ST14, molding step ST2, and thinning step ST15 which are steps of the method of manufacturing a molded chip according to the first embodiment or the second embodiment. In other steps, the protective member 120 is similarly a hard substrate. The protective member 120 according to the third modification is in the form of a circular plate larger in diameter than the wafer 10 and the molded wafer 18, and is stuck to the face side 5 of the wafer 10 by an adhesive member 121.

Since the method of manufacturing a molded chip according to the third modification allows the reverse sides 7 and the side faces 8 of the device chips 2 to be covered with the resin molding 3 while the devices 6 of the wafer 10 are being kept in relative positions, the method of manufacturing a molded chip according to the third modification is advantageous in that electrodes and electrode bumps on the device faces are prevented from being contaminated by the resin molding 3 and electric connections of the devices 6 are secured, as with the first and second embodiments.

The present invention is not limited to the above embodiments and modifications. Rather, various changes and modifications may be made without departing from the scope of the invention. For example, though the protective member 100 that is thermally insulative is used in the first and second embodiments, etc., a protective member that is not thermally insulative may be stuck to the face side of the wafer 10 in preparing step ST1, and the protective member that is not thermally insulative may be peeled off and the protective member 100 that is thermally insulative may be stuck to the wafer 10, i.e., the face sides 5 of the device chips 2 before molding step ST2.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a molded chip from a wafer having an arcuate outer circumferential edge, comprising:
    an edge trimming step of trimming off an arcuate portion of the arcuate outer circumferential edge on a face side of the wafer along the outer circumferential edge;
    a preparing step of sticking device faces of a plurality of device chips arrayed to a protective member that is thermally insulative, thereby forming a chip group of the device chips;
    a molding step of, after the preparing step, supplying a molding resin to reverse sides of the device chips and gaps between the device chips, thereby forming a molded wafer in which the reverse sides and side faces of the device chips are covered with a resin molding; and
    a molded wafer dividing step of, after the molding step, dividing the molded wafer along centers of the gaps filled with the resin molding into molded chips on a basis of an image in which the face side of the molded wafer has been imaged.

2. The method of manufacturing a molded chip according to claim 1, wherein the preparing step includes
    a groove forming step of forming grooves in the wafer having a plurality of areas demarcated by a grid of projected dicing lines on the face side of the wafer and a plurality of devices formed respectively in the areas, to a depth larger than a finished thickness,
    a protective member sticking step of sticking the protective member to the face side of the wafer in which the grooves have been formed, and
    a grinding step of grinding a reverse side of the wafer, thereby exposing the grooves on the wafer and dividing the wafer into the device chips.

3. The method of manufacturing a molded chip according to claim 1, wherein
the preparing step includes
a thinning step of grinding a reverse side of the wafer having a plurality of areas demarcated by a grid of projected dicing lines on the face side of the wafer and a plurality of devices formed respectively in the areas, thereby thinning the wafer to a finished thickness, and
a dividing step of dividing the thinned wafer along the projected dicing lines.

4. The method of manufacturing a molded chip according to claim 3, wherein the protective member is made from a flexible material.

5. The method of manufacturing a molded chip according to claim 3, wherein the protective member is made from a hard material.

6. The method of manufacturing a molded chip according to claim 1, wherein
the molding resin supplied to the reverse sides of the device chips is pressed against the reverse sides of the device chips in a mold in the molding step.

7. A method of manufacturing a molded chip, comprising:
a preparing step of sticking device faces of a plurality of device chips arrayed to a protective member that is thermally insulative, thereby forming a chip group of the device chips;
a molding step of, after the preparing step, supplying a molding resin to reverse sides of the device chips and gaps between the device chips, thereby forming a molded wafer in which the reverse sides and side faces of the device chips are covered with a resin molding;
a molded wafer dividing step of, after the molding step, dividing the molded wafer along centers of the gaps filled with the resin molding into molded chips on a basis of an image in which the face side of the molded wafer has been imaged; and
an expanding step of, after the preparing step and before the molding step, expanding the protective member in planar directions, thereby widening distances between the device chips.

8. A method of manufacturing a molded chip, comprising:
a preparing step of sticking device faces of a plurality of device chips arrayed to a protective member that is thermally insulative, thereby forming a chop group of the device chips;
a molding step of, after the preparing step, supplying a molding resin to reverse sides of the device chips and gaps between the device chips, thereby forming a molded wafer in which the reverse sides and side faces of the device chips are covered with a resin molding;
a molded wafer dividing step of, after the molding step, dividing the molded wafer along centers of the gaps filled with the resin molding into molded chips on a basis of image in which the face side of the molded wafer has been imaged;
a protective member peeling step of, after the molding step, sticking an adhesive tape to a reverse side of the molded wafer and peeling off the protective member from the face side of the molded wafer,
wherein the molded wafer is divided from the face side of the molded wafer in the molded wafer dividing step.

* * * * *